(12) United States Patent
Lecompte

(10) Patent No.: US 11,909,411 B2
(45) Date of Patent: Feb. 20, 2024

(54) REDUCING SPURS IN ANALOG TO DIGITAL AND DIGITAL TO ANALOG CONVERSIONS

(71) Applicant: Viavi Solutions Inc., San Jose, CA (US)

(72) Inventor: Michel Lecompte, San Jose, CA (US)

(73) Assignee: Viavi Solutions Inc., Chandler, AZ (US)

( * ) Notice: Subject to any disclaimer, the term of this patent is extended or adjusted under 35 U.S.C. 154(b) by 69 days.

(21) Appl. No.: 17/482,791

(22) Filed: Sep. 23, 2021

(65) Prior Publication Data

US 2023/0091375 A1    Mar. 23, 2023

(51) Int. Cl.
*H03M 1/08* (2006.01)
*H03M 1/06* (2006.01)
*H03M 1/12* (2006.01)
*H03M 1/66* (2006.01)

(52) U.S. Cl.
CPC ....... *H03M 1/0836* (2013.01); *H03M 1/0675* (2013.01); *H03M 1/0863* (2013.01); *H03M 1/12* (2013.01); *H03M 1/66* (2013.01)

(58) Field of Classification Search
CPC .... H03M 1/0836; H03M 1/0675; H03M 1/12; H03M 1/66; H03M 1/086
USPC .......................................... 341/118, 144, 155
See application file for complete search history.

(56) References Cited

U.S. PATENT DOCUMENTS

| | | | | |
|---|---|---|---|---|
| 5,563,596 A | * | 10/1996 | Snyder | H03M 1/0614 341/131 |
| 6,204,790 B1 | * | 3/2001 | Jin | H03M 1/68 341/145 |
| 6,473,013 B1 | * | 10/2002 | Velazquez | H03M 1/1215 341/120 |
| 8,441,379 B2 | * | 5/2013 | Eklund | H03M 1/0675 341/120 |
| 9,807,504 B2 | * | 10/2017 | Melanson | H04R 3/04 |
| 10,224,950 B2 | * | 3/2019 | Stuart | H03M 1/0639 |

* cited by examiner

*Primary Examiner* — Khai M Nguyen
(74) *Attorney, Agent, or Firm* — DLA PIPER LLP (US)

(57) ABSTRACT

Embodiments disclosed herein may reduce or even eliminate spurs introduced into the signals during analog to digital or digital to analog conversions. The spurs may be introduced by components such as clocks of the converter circuits. In an analog to digital conversion, the input signal may be split into two parts: the first portion passing through a first analog to digital converter (ADC) and an inverted second portion passing through a second ADC. A digital subtractor may subtract the output of the second ADC from the output of the first ADC converter thereby reducing the spurs. In digital to analog conversion, a digital input is passed through a first digital to analog converter (DAC) and an inverted digital input is passed through a second DAC. The output of the second DAC is inverted and combined with the output of the first DAC to reduce the spurs.

17 Claims, 7 Drawing Sheets

REDUCING SPURS IN ANALOG TO DIGITAL AND DIGITAL TO ANALOG CONVERSIONS

DETAILED DESCRIPTION OF SEVERAL EMBODIMENTS

Figure 1:
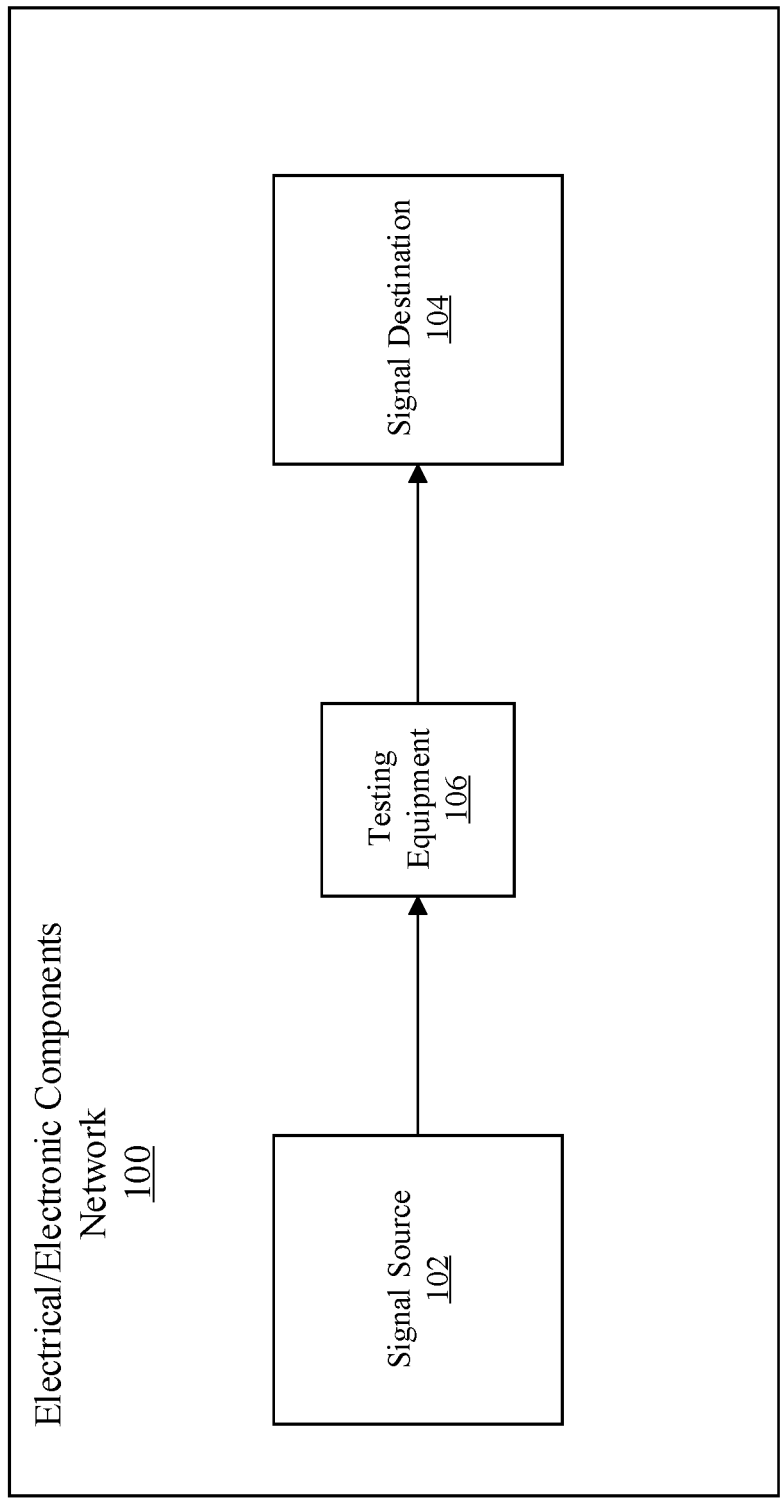
FIG. 1 shows an example network according to an example of the present disclosure.

Analog to digital converter (ADC) or digital to analog converter (DAC) circuits may introduce spurs (also referred to as spurious signal) in the output. The spurs may include unwanted signals, e.g., noise, that may interfere with the actual signal being converted. Some spurs may even be within the input signal itself; and these existing spurs in the input signal may be compounded by spurs introduced by conversion circuits. The spurs may degrade the signal quality by reducing the spurious-free dynamic range (SFDR) of the signal.

Embodiments disclosed herein may reduce spurs during analog to digital or digital to analog conversion by using parallel conversion components (e.g., ADCs or DACs); inverting or anti-phasing the signal passing through one of the parallel pathways; and combining the parallel outputs (with one output inverted or anti-phased) to generate a converted output. For an analog to digital conversion, two parallelly arranged ADCs may be used. An input analog signal may be split to provide the first split portion to a first ADC and to provide an inverted second split portion to a second ADC. The inverted second split portion may be identical to but an inverted version of the first split portion. From a first output component of the first ADC, a second output component of the second ADC may be subtracted. This subtraction may cause a mutual reduction (or even elimination) of spurs in the first output component and the corresponding spurs in the second output component. This subtraction, however, may cause the signals in the output components to get added because the second component of the subtraction is an inverted output (e.g., by the virtue of a double negative being a positive). Similar results may be achieved by phase shifting the second split portion by 180 degrees with the respect to the first split portion, instead of inverting the second split portion. The phase shifting for the second split signal may be performed by shifting the phase of each frequency by sweeping across the frequency range. The inversion example may be generally used for wideband signals, while the phase shifting examples may be used for narrowband signals.

Analogously, for digital to analog conversions, two parallelly arranged DACs may be used. An input digital signal may be provided to the first DAC and an inverted input signal may be provided to the second DAC. A first analog output component of the first DAC may be combined with an inverted second analog output component of the second DAC. This combination may cancel out spurs in the first analog output component and the second analog output component because of the inversion of spurs in the second analog output component. However, the signals may be added because of the double inversion (the spurs only go through a single inversion): the first inversion of the digital signal prior to providing it to the second DAC, and the second inversion of the second analog output component. Similar results may be achieved by phase shifting (instead of inverting) the second analog output component by 180 degrees with respect to the first analog output component. The phase shifting for the second analog output component may be performed by shifting the phase of each frequency by sweeping across the frequency spectrum. The inversion example may be generally used for wideband signals, while the phase shifting examples may be used for narrowband signals.

The above described spur reductions during conversion may be achieved by repurposing integrated circuits (ICs) manufactured for communications. For instance, testing circuits may be assembled using communication ICs, which generally include multiple ADCs and DACs (e.g., dual, quad, or even octo) within a single chip. Out of these multiple ADCs and DACs, a testing circuit may need—and conventional testing circuits generally use—just one ADC or DAC for a corresponding conversion. Embodiments disclosed herein may leverage the presence these unused ADCs and DACs to improve the converted signal quality by reducing spurs, according to the principles described herein.

In an embodiment, an apparatus to reduce spurs in an analog to digital conversion comprises an input configured to receive an analog signal; a splitter configured to split the analog signal into a first split analog signal and a second split analog signal; a first analog to digital converter configured to receive the first split analog signal and generate a first component digital signal; a second analog to digital converter configured to receive the second split analog signal and generate a second component digital signal; and a digital subtractor configured to generate an output digital signal with reduced spurs by subtracting a spur in the first component digital signal from a corresponding spur in the second component digital signal.

In another embodiment, an apparatus to reduce spurs in a digital to analog conversion comprises an input configured to receive a digital signal; a first digital to analog converter configured to receive the digital signal and generate a first component analog signal; a second digital to analog converter configured to receive an inverted digital signal and generate a second component analog signal; and an analog combiner configured to generate an output analog signal with reduced spurs by subtracting a spur in the first component analog signal from a corresponding spur in the second component analog signal.

In another embodiment, an apparatus to reduce spurs in a signal conversion comprises a first converter configured to generate a first converted output component signal from an input signal; a second converter configured to generate a second converted output component signal from the input signal, wherein the first converter and the second converter are embedded within a single integrated circuit; an output combiner configured to generate a converted output signal with reduced spurs by subtracting a spur in the first converted output component signal from a corresponding spur in the second converted output component signal.

FIG. 1 shows an example network 100 according to an example of the present disclosure. The network 100 may be any kind of an electrical/electronic network comprising any number of electrical and/or electronic components. For example, the network 100 may be a telecommunications network comprising telecommunications components such as routers, repeaters, and terminals. As another example, the network 100 may be a power grid network comprising power lines and control stations. The network 100 may be also any type of communication network such as a local area network (LAN), metropolitan area network (MAN), and/or a wide area network (WAN) such as the Internet. Therefore, any type of packet switching, circuit switching, and/or power delivery network is within the scope of this disclosure.

Some example components in the network may include a signal source 102 component and a signal destination 104 component. The signal source 102 may be any kind of communication device generating an analog and/or a digital signal. The signal generated by the signal source 102 may be received by the signal destination 104. The signal destination 104 may be any kind of communication device communicating with the signal source 102 by receiving (and also transmitting) the signals. Testing equipment 106 may be provided to test and/or verify one or more signals from the signal source 102 to the signal destination 104. As an example use case in a telecommunications network, the signal source 102 may be a router, the signal destination 104 may be a repeater, and the testing equipment 106 may be a device to test and/or verify the validity of signals from the router to the repeater. The testing equipment 106 may have to convert to a digital signal, an analog signal generated by the signal source 102 for the signal destination 104. Alternatively, the testing equipment 106 may have to convert to an analog signal, a digital signal generated by signal source 102 for the signal destination 104. The testing equipment 106 may therefore include one or more ADC and DAC circuits, details of which are provided below.

Figure 2A:
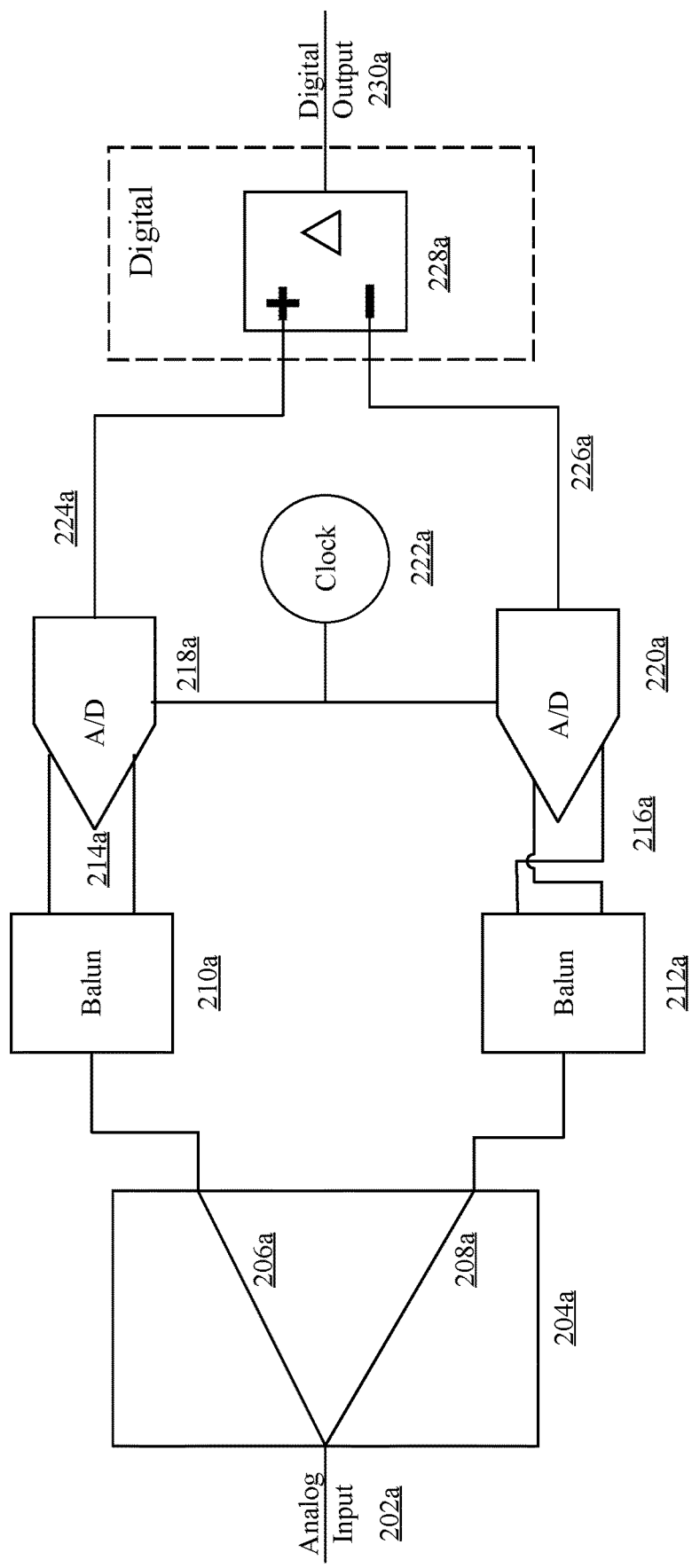
FIG. 2A shows an example of an analog to digital converter based on the principles disclosed herein.

FIG. 2A shows an example of an ADC circuit 200a, according to the principles disclosed herein. It should be understood that the circuit 200a shown in FIG. 2A and described herein is just an example, and other types of circuits with additional, alternate, and fewer number of components are also within the scope of this disclosure. The testing equipment 106 may use the ADC circuit 200a for an analog to digital conversion.

In the ADC circuit 200a, an analog splitter 204a may receive an analog input 202a and split the received analog input 202a into a first split analog input 206a and a second split analog input 208a. The first analog input 206a and the second split analog input 208a may be identical signals. A first balun 210a may receive the first split analog input 206a and a second balun 212a may receive the second split analog input 208a. A balun (e.g., the first balun 210, the second balun 212a, and/or the other baluns described throughout this disclosure) may include any type of electric component or electric circuit, passive or active, that may perform a "balanced" ("differential") or "unbalanced" (or "single ended") conversion. The first balun 210a may generate a differential output 214a and the second balun 212a may generate another differential output 216a, based on the corresponding first and second analog inputs 206a and 208a. A first ADC (also referred to as an A/D converter) 218a may receive the differential output 214a and the second ADC 220a may receive an inverted version of the differential output 216a. The second ADC 220a may receive the inverted version of the differential output 216a because the second balun 212a may be connected to the second ADC in a reverse polarity compared to the connection between the first balun 210a and the first ADC 218a. A clock 222a may drive the ADCs 218a and 220a and/or other components of the ADC circuit 200a. The ADC 218a may convert the first split analog input 206a, received as a differential output 214a of the balun 210a, to a component digital signal 224a. Similarly, the ADC 220a may convert the first split analog input 208a, received as an inverted version of the differential output 216a of the balun 212a, to a component digital signal 226a.

The components (described herein and/or other components) of the ADC circuit 200a may introduce spurs in the signal being converted. For instance, the clock 222a may introduce spurs (e.g., due to the clock voltage fluctuations during switching) into the analog signals being converted by the ADCs 218a and 220a. Because the ADCs 218a, 220a may be identical and parallelly performing the conversion, the clock 222a may introduce similar or even nearly identical spurs in the signals. Therefore, the component digital signals 224a and 226a may have similar or even nearly identical spurs, whereas the signal portions of these component digital signals 224a and 226a may be opposite because of the inverted differential input to the ADC 220a.

A digital subtractor 228a (or any component executing a digital subtraction algorithm) may receive the component digital signals 224a and 226a. The digital subtractor 228a may then subtract the component digital signal 226a from the component digital signal 224a. This subtraction operation may reduce similar spurs or even cancel out identical spurs. The subtraction operation may, however, add the signal portion of the component digital signals 224a and 226a. To represent these operations mathematically, let $S_t$ represent the signal portion of the component digital signal 224a at time t. Due to the inverted version of the differential input to the ADC 220a, the signal portion of the component digital signal 226a at the time t may be $-S_t$. Let $N_t$ may be spur introduced to each of the component digital signals 224a and 226a. Therefore, the component digital signal 224a may be represented as:

$$S_t + N_t$$

And the component digital signal 226a may be represented as:

$$-S_t + N_t$$

Therefore, the subtraction operation performed by the digital subtractor 228a may result in:

$$S_t + N_t - (-S_t + N_t) = (S_t + S_t) + (N_t - N_t) = 2S_t$$

As a result, the signal portions ($S_t$ and $-S_t$) are added to generate at time t an output signal 230a as $2S_t$ and the spur $N_t$ may be reduced or even cancelled out.

The ADC circuitry 200a may be used for any kind of signals, including wideband and narrowband signals. Furthermore, the ADC circuitry 200a may be used to reduce any kind of spur such as signal related spurs, not just the clock related spurs detailed above.

Figure 2B:
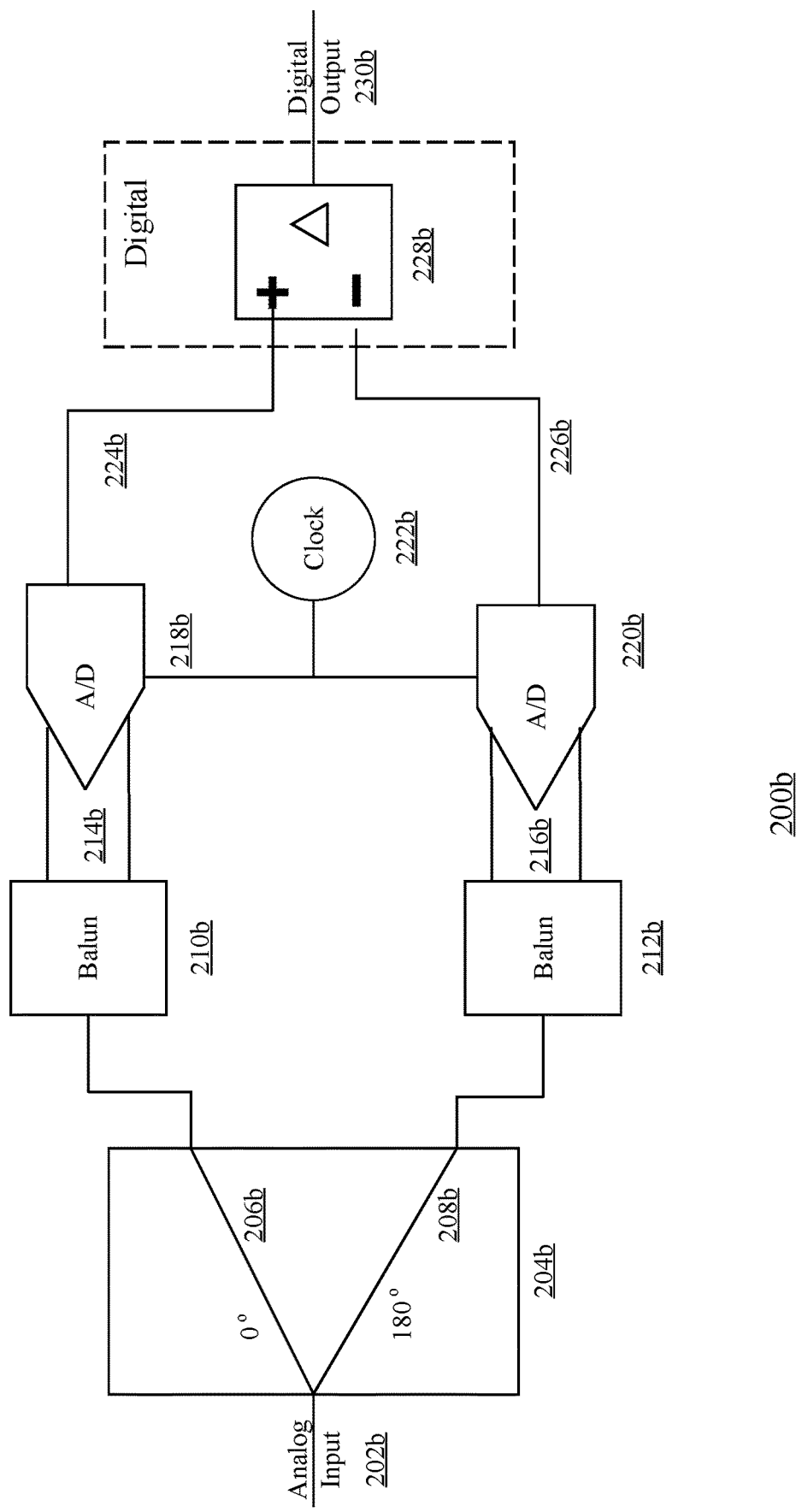
FIG. 2B shows another example of an analog to digital converter circuit based on the principles disclosed herein.

FIG. 2B shows another example of an ADC circuit 200b, based on the principles disclosed herein. The components of the ADC circuit 200b may be similar to the components of the ADC circuit 200a, and similar components are labeled with the same numerals but different letters. As discussed above, it should also be understood that the ADC circuit 200b is just as example, and other ADC circuits with additional, alternate, and fewer number of components are also within the scope of this disclosure. The testing equipment 106 may use the ADC circuit 200b in addition to or as an alternative to the ADC circuit 200a.

The operation of the ADC circuit 200b may be similar to that of ADC circuit 200a, except for the usage of anti-phasing in ADC circuit 200b instead of the inversion used in the ADC circuit 200a. More particularly, an analog splitter 204b (which may be different from the analog splitter 204a in the ADC circuit 200a because of the additional phase shifting functionality) may shift the phase of the second split analog signal by 180 degrees to generate a phase shifted analog signal 206b. Alternatively, this phase shifting may be performed by a separate phase shifting component (not shown). The phase shifting by 180 degrees in the analog domain may be similar to inversion. In other words, the phase shifting by 180 degrees, while operationally different, may be mathematically equivalent to inversion performed in the ADC circuit 200a.

The first split analog signal 206b may be processed and converted to a first component digital signal 224b similar to the process described with regard to FIG. 2A for the conversion of the first split analog signal 206a to the first component digital signal 224a. The phase shifted analog signal 208b may have a different operation compared to the second split analog signal 208a in FIG. 2A. A balun 212b receives the phase shifted analog signal 208b and generates a differential output 216b. Because the phase shifting may have already inverted the phase shifted analog signal 208b with respect to the first split analog signal 206b, the differential output 216b of the balun 212b may not have to be inverted. Furthermore, as the ADC 220b may be converting an inverted signal (again, due to the phase shifting by 180 degrees), component digital outputs 224b and 226b of the ADC 200b may be similar to the component digital outputs 224a and 226a. The digital output 230b may be similarly generated by the digital subtractor 228b from the component digital outputs 224a and 226a.

The ADC conversion circuitry 200b may generally used for narrowband signals. Individual frequencies in the analog input 202b may be phase shifted by 180 degrees while sweeping across all the frequencies in the narrowband.

Figure 2C:
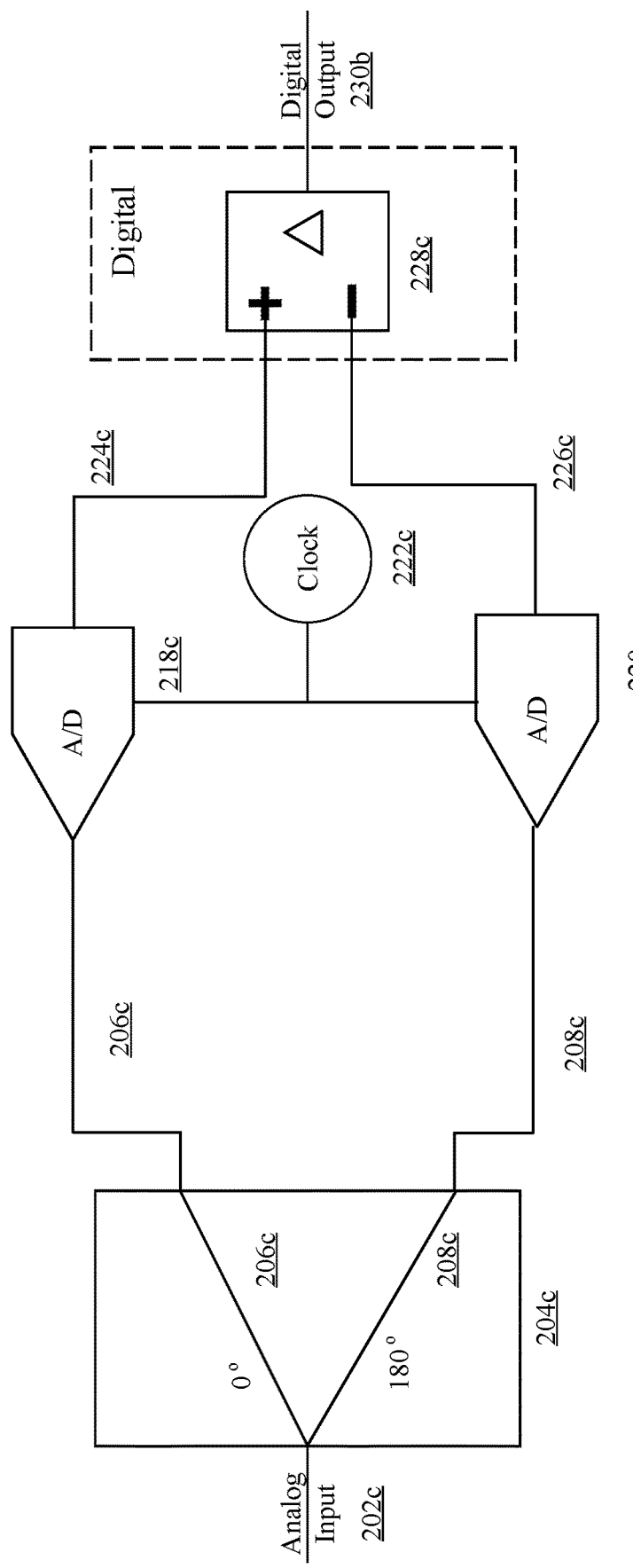
FIG. 2C shows yet another example of an analog to digital converter circuit based on the principles disclosed herein.

FIG. 2C shows another example of an ADC circuit 200c, based on the principles disclosed herein. The components of the ADC circuit 200c may be similar to the components of the ADC circuit 200b, and similar components are labeled with the same numerals but different letters. However, the ADC circuit 200c may not have the baluns as the ADC circuit 200b. Therefore, a first split analog signal 206c and a phase shifted analog signal 208c may be provided to an ADCs 218c and 220c, respectively, without using baluns therein between generating a differential output. At low speeds generally, ADCs 218c and 220c may function with single ended inputs (here 206c and 208c), and hence a differential input from a balun may not be desired. Other functionality of the ADC circuit 200c may be similar to the corresponding functionality of the ADC circuit 200b.

Figure 3A:
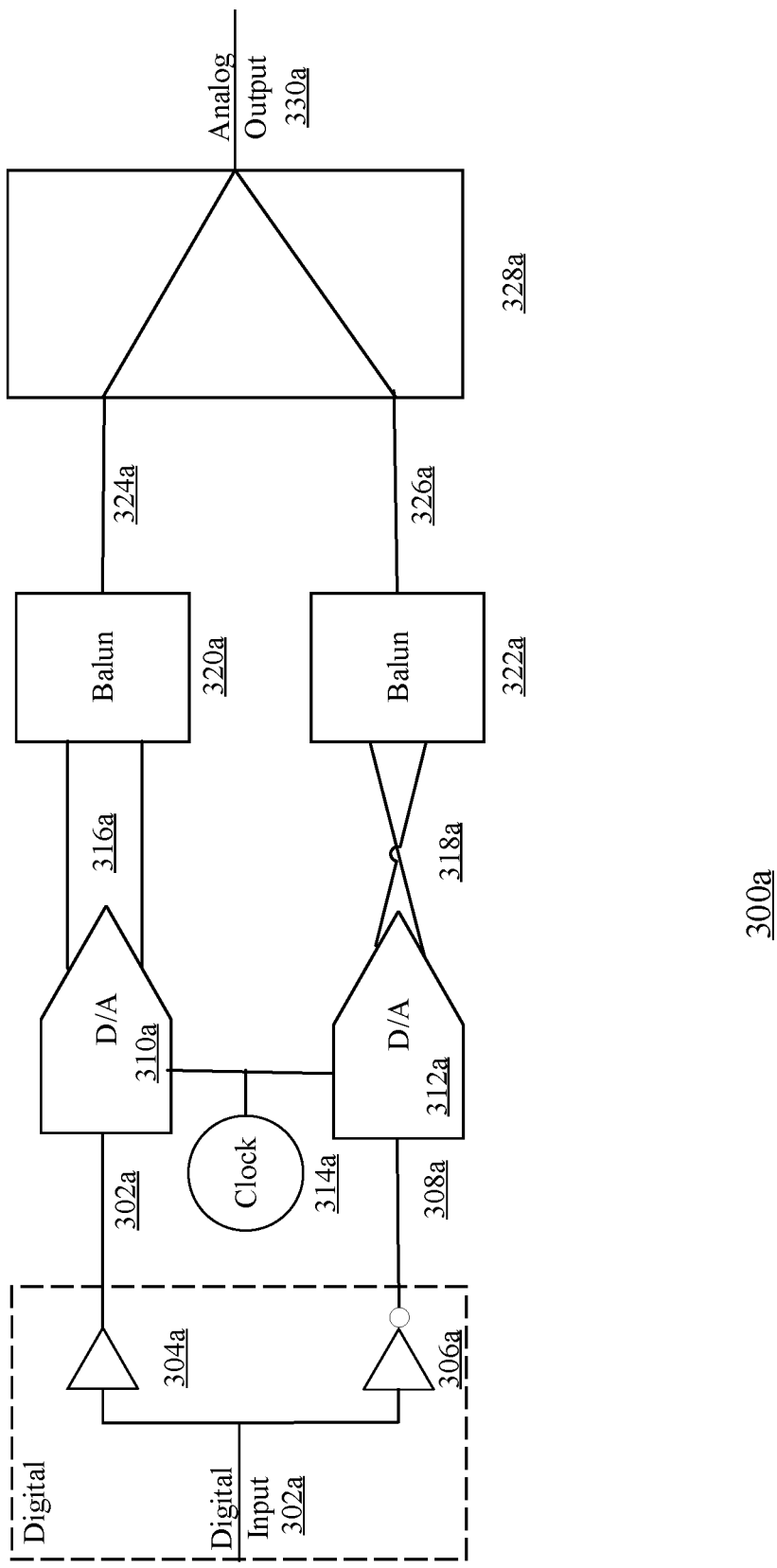
FIG. 3A shows an example of a digital to analog converter circuit based on the principles disclosed herein.

FIG. 3A shows an example of a DAC circuit 300a, according to the principles disclosed herein. The DAC circuit 300a may reduce or cancel spurs introduced in the signal being converted by the components of the DAC circuit (and/or even signal related spurs). It should be understood that the DAC circuit 300a shown in FIG. 3A and described herein is just an example and circuits with additional, alternate, or fewer number of components are also within the scope of this disclosure. The testing equipment 106 may use the DAC circuit 300a for digital to analog conversion.

In operation, the DAC circuit 300a may receive a digital input signal 302a. A buffer 304a may buffer and temporarily hold the digital signal 302a prior to providing it to a first DAC 310 a (also referred to as a D/A converter). A digital signal inverter 306a (e.g., a digital NOT gate) may invert the received digital signal 302a into an inverted input digital signal 308a. The first DAC 310a may convert the buffered digital input signal 302a to a differential analog signal 316a. A second DAC 312a may convert the inverted input digital signal 308a to a differential analog signal 318a. A first balun 320a may convert the differential analog signal 316a to a component analog signal 324a. A second balun 322a may receive an inverted version of the differential analog signal 318a and convert it to the component analog signal 326a. The second balun 322a may receive the inverted version of the differential signal 218a because the second balun 322a may be connected to the second DCA 312a in a reverse polarity compared to the connection between the first balun 320a and the first DCA 310a. An analog combiner 328a may combine the component analog signal 324a and component analog signal 326a to generate an analog output signal 330a.

The digital inversion, as performed by the digital signal inverter 360a, combined with the inversion of the differential analog signal 318a may generate similar or identical signal portions in each of the component analog signals 324a and 324b. However, the inversion of the differential analog signal 318a may result in the spurs in the component analog signal 326a being inverted with respect to the corresponding spurs in the component analog signal 324a. Mathematically, if $A_t$ is the amplitude of the signal portion of the component analog signal 324a at time t, then $A_t$ may also be the amplitude of the signal portion of the component analog signal 326a at time t. The double inversion, one in the digital domain and another in the analog domain, may result in identical or similar signal portions for the component analog signals 324a and 326a. However, any spurs introduced by the components of the DAC circuit 300a (e.g., spurs introduced by the clock 314a) may be inverted only in the analog domain by inversely connecting differential analog signal 318a to the second balun 322a. Therefore if the amplitude of the spur in the component analog signal 324a at time t is $N_t$, then the amplitude of the spur in the component analog signal 326a at time t is $-N_t$.

The combination operation performed by the analog combiner at time t can be mathematically represented as:

$$(S_t+N_t)[\text{component analog signal 324}a]+(S_t-N_t)[\text{component analog signal 326}a]=2S_t$$

The spurs are therefore reduced or even eliminated during the analog combination operation, but the signals portions are added.

The DAC circuit 300a can be used for any type of digital to analog conversion. For instance, the DAC circuit 300a can be used for converting wideband or narrowband signals. In addition to spurs introduced by the circuit components, the DAC circuit 300a may reduce or eliminate signal related spurs as well.

Figure 3B:
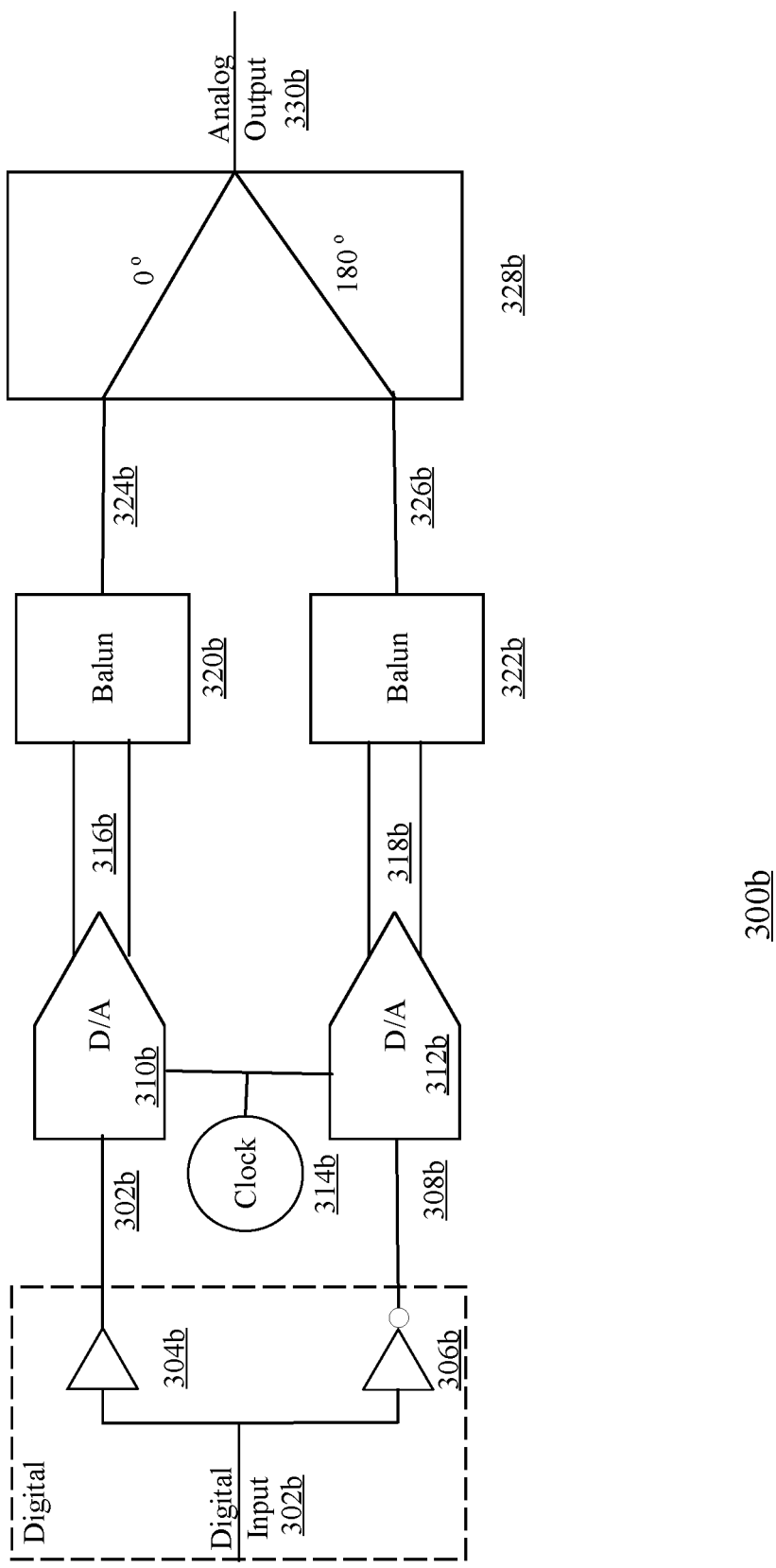
FIG. 3B shows another example of a digital to analog converter based on the principles disclosed herein.

FIG. 3B shows a DAC circuit 300b, based on the principles described herein. The DAC circuit 300b may include similar components as the DAC circuit 300a, and these similar components have been labeled with the same numerals (with the letters being different). As with the DAC circuit 300a, the DAC circuit 300b is just an example, and circuits with additional, alternate, or fewer number of components are within the scope of this disclosure. The testing equipment 106 may use the DAC circuit 300b in addition to or as an alternative to the DAC circuit 300a.

The DAC circuit 300*b* may perform similar operations as the DAC circuit 300*a* until differential analog signals 316*b* and 318*b* are generated by a first balun 320*b* and a second balun 322*b*, respectively. The differential analog signal 316*b* may undergo similar signal processing as the differential analog signal 316*a* in the DAC circuit 300*a*. However, the differential analog signal 318*b* may not be inverted like the differential analog signal 318*a* in the DAC circuit 300*a*. Therefore, the signal portion of a second component analog signal 326*a*, generated by the second balun 322*b*, is phase shifted by 180 degrees from the signal portion of the first component analog signal 324*b* generated by the first balun 320*b*. However, any spurs in any of the component analog outputs 324*b* and 326*b* may be in phase because the input to the second balun 322*b* is not inverted.

To bring the signal portion of the component analog outputs 324*b* and 326*b* in phase, the analog combiner 328*b* may phase shift the component analog signal 326*b* by 180 degrees. Alternatively, the analog combiner may phase shift the component analog signal 324*b* by 180 degrees. Regardless of which of the component analog output 324*b* and 326*b* is phase shifted by 180 degrees, the signal portions are brought in phase, but the spurs are taken out of phase. The combination operation by the analog combiner 328*b* therefore enhances the signal portion while reducing or even cancelling out the spurs. The phase shifting functionality may be integrated into the analog combiner 328 or may be performed by a separate phase shifter (not shown).

The DAC circuit 300*b* may generally be used for converting narrowband signals. For each conversion, the DAC circuit 300*b* may shift the phase the individual frequencies while sweeping the narrowband spectrum. Furthermore, the DAC circuit 300*b* may reduce signal related spurs, in addition to the spurs generated by the components of the DAC circuit 300*b*.

Figure 3C:
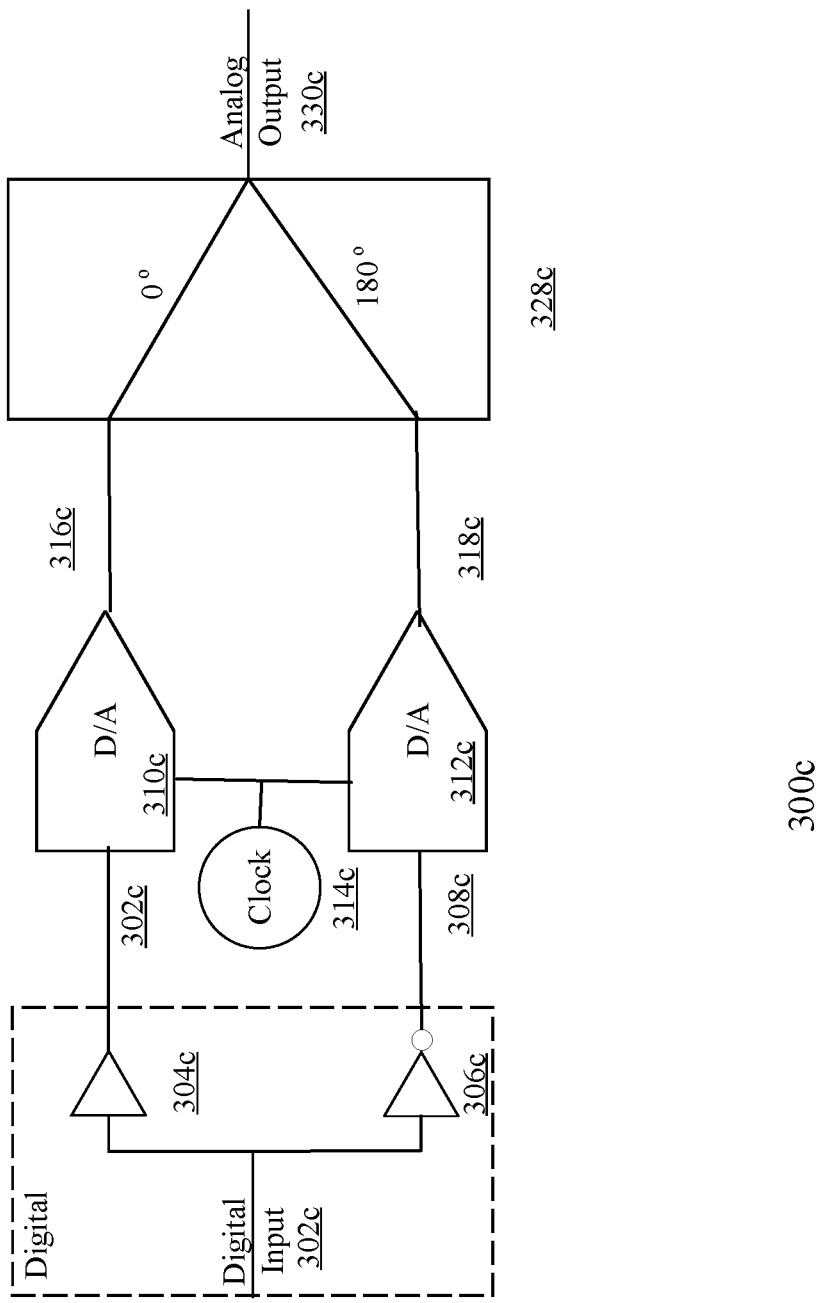
FIG. 3C shows another example of a digital to analog converter based on the principles disclosed herein

FIG. 3C shows another example of an DAC circuit 300*c*, based on the principles disclosed herein. The components of the DAC circuit 300*c* may be similar to the components of the DAC circuit 300*b*, and similar components are labeled with the same numerals but with different letters. However, the DAC circuit 300*c* may not have the baluns as the DAC circuit 300*b*, because the DACs 310*c* and 312*c* may generate single ended outputs 316*c* and 318*c*, not differential outputs as in DAC circuit 300*a* and 300*b*. The DACs 310*c* and 312*c* may generate single ended output generally at low speeds. The single ended outputs 316*c* and 318*c* (output 318*c* being phase shifted by 180 degrees) may then be directly provided to an analog combiner 328*c*, which may generate an analog output 330*c*. Other functionality of the DAC circuit 300*c* may be similar to the corresponding functionality of the DAC circuit 300*b*.

While various embodiments have been described above, it should be understood that they have been presented by way of example and not limitation. It will be apparent to persons skilled in the relevant art(s) that various changes in form and detail can be made therein without departing from the spirit and scope. In fact, after reading the above description, it will be apparent to one skilled in the relevant art(s) how to implement alternative embodiments. For example, other steps may be provided, or steps may be eliminated, from the described flows, and other components may be added to, or removed from, the described systems. Accordingly, other implementations are within the scope of the following claims.

In addition, it should be understood that any figures which highlight the functionality and advantages are presented for example purposes only. The disclosed methodology and system are each sufficiently flexible and configurable such that they may be utilized in ways other than that shown.

Although the term "at least one" may often be used in the specification, claims and drawings, the terms "a", "an", "the", "said", etc. also signify "at least one" or "the at least one" in the specification, claims and drawings.

Finally, it is the applicant's intent that only claims that include the express language "means for" or "step for" be interpreted under 35 U.S.C. 112(f). Claims that do not expressly include the phrase "means for" or "step for" are not to be interpreted under 35 U.S.C. 112(f).

What is claimed is:

1. An apparatus to reduce spurs in an analog to digital conversion, the apparatus comprising:
    an input configured to receive an analog signal;
    a splitter configured to split the analog signal into a first split analog signal and a second split analog signal;
    a signal inverter configured to convert the second split analog signal into an inverted second split analog signal;
    a first balun configured to provide a differential input of the first split analog signal to the first analog to digital converter;
    a first analog to digital converter configured to receive the first split analog signal and generate a first component digital signal;
    the signal inverter further comprising a second balun configured to provide an inverted differential input of the second split analog signal as the inverted second split analog signal to the second analog to digital converter;
    a second analog to digital converter configured to receive the inverted second split analog signal and generate a second component digital signal; and
    a digital subtractor configured to generate an output digital signal with reduced spurs by subtracting a spur in the first component digital signal from a corresponding spur in the second component digital signal.

2. The apparatus of claim 1, wherein the first split analog signal is identical to the second split analog signal.

3. The apparatus of claim 1, wherein the inverted differential input is based on a connection of the second balun to the second analog to digital converter in a reverse polarity compared to a connection of the first balun to the first analog to digital converter.

4. The apparatus of claim 1, wherein each of the first balun and the second balun comprises an active circuit or a passive circuit.

5. The apparatus of claim 1, the signal inverter further comprising:
    a phase shifter configured to shift the phase of the first split analog signal by 180 degrees with respect to the second split analog signal to generate the inverted second split analog signal such that an input to the first analog to digital converter is phase shifted by 180 degrees with respect to an input to the second analog to digital converter.

6. The apparatus of claim 5, wherein the first analog to digital converter is configured to receive the first split analog signal as a single ended input, and wherein the second analog to digital converter is configured to receive the phase shifted second split analog signal as a single ended input.

7. The apparatus of claim 1, wherein the first analog to digital converter and the second analog to digital converter are embedded within a single integrated circuit.

8. The apparatus of claim 1, wherein the first analog to digital converter and the second analog to digital converter are configured to be driven by a same clock.

9. An apparatus to reduce spurs in a digital to analog conversion, the apparatus comprising:
   an input configured to receive a digital signal;
   a first digital to analog converter configured to receive the digital signal and generate a first component analog signal;
   a first balun configured to receive a differential input of the first component analog signal from the first digital to analog converter and output the first component analog signal to an analog combiner based on the differential input;
   a signal inverter configured to convert the digital signal and generate an inverted digital signal;
   a second digital to analog converter configured to receive the inverted digital signal and generate a second component analog signal;
   a second balun configured to receive an inverted differential input of the first component analog signal from the second digital to analog converter and output the second component analog signal to the analog combiner based on the inverted differential input; and
   the analog combiner configured to generate an output analog signal with reduced spurs by subtracting a spur in the first component analog signal from a corresponding spur in the second component analog signal.

10. The apparatus of claim 9, wherein the inverted differential input is based on a connection of the second balun to the second digital to analog converter in a reverse polarity compared to a connection of the first balun to the first digital to analog converter.

11. The apparatus of claim 9, wherein each of the first balun and the second balun comprises an active circuit or a passive circuit.

12. The apparatus of claim 9, further comprising:
   a phase shifter configured to shift the phase of the first component analog signal by 180 degrees with respect to the second component analog signal such that the inputs to the analog combiner are phase shifted from each other by 180 degrees.

13. The apparatus of claim 12, wherein the first component analog signal is a single ended output of the first digital to analog converter and the second component analog signal is a single ended output of the second digital to analog converter.

14. The apparatus of claim 9, wherein the first digital to analog converter and the second digital to analog converter are embedded within a single integrated circuit.

15. The apparatus of claim 9, wherein the first digital to analog converter and the second digital to analog converter are configured to be driven by a same clock.

16. An apparatus to reduce spurs in signal conversion, the apparatus comprising:
   a first converter configured to generate a first converted output component signal from an input signal;
   a first balun configured to provide a differential input of the input signal to the first converter;
   a signal inverter configured to generate an inverted input signal from the input signal;
   a second converter configured to generate a second converted output component signal from the inverted input signal, wherein the first converter and the second converter are embedded within a single integrated circuit;
   a second balun configured to provide an inverted differential input of the inverted input signal to the second converter; and
   an output combiner configured to generate a converted output signal with reduced spurs by subtracting a spur in the first converted output component signal from a corresponding spur in the second converted output component signal.

17. The apparatus of claim 16, wherein the input signal comprises an analog signal and the converted output signal comprises a digital signal.

* * * * *